United States Patent
Sato

(10) Patent No.: US 10,985,673 B1
(45) Date of Patent: Apr. 20, 2021

(54) PARALLEL SYNCHRONIZED OPERATION FOR A HALF-BRIDGE CONFIGURATION IN A SWITCH MODE POWER SUPPLY

(71) Applicant: Renesas Electronics America Inc., Milpitas, CA (US)

(72) Inventor: Tetsuo Sato, San Jose, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 16/749,841

(22) Filed: Jan. 22, 2020

Related U.S. Application Data

(60) Provisional application No. 62/821,335, filed on Mar. 20, 2019.

(51) Int. Cl.
| | |
|---|---|
| H02M 7/5395 | (2006.01) |
| H03C 1/54 | (2006.01) |
| H02M 1/08 | (2006.01) |
| H02M 1/38 | (2007.01) |
| H02M 3/335 | (2006.01) |

(52) U.S. Cl.
CPC ........... *H02M 7/5395* (2013.01); *H02M 1/08* (2013.01); *H02M 1/38* (2013.01); *H02M 3/33507* (2013.01); *H03C 1/54* (2013.01); *H03C 2200/0045* (2013.01)

(58) Field of Classification Search
CPC ............. H03C 1/54; H03C 2200/0045; H02M 7/5395; H02M 1/38; H02M 1/08; H02M 3/158; H02M 3/33507
USPC ........ 363/41, 56.02, 78, 79; 307/45, 42, 125
See application file for complete search history.

(56) References Cited

U.S. PATENT DOCUMENTS

2015/0365003 A1* 12/2015 Sadwick ................. H02M 3/28
363/21.01
2020/0287456 A1* 9/2020 Zuccollo ................. H02M 1/08

* cited by examiner

*Primary Examiner* — Arnold M Kinkead
(74) *Attorney, Agent, or Firm* — Foley & Lardner LLP

(57) ABSTRACT

One or more embodiments relate to a circuit that can be used to prevent cross conduction in an SMPS including multiple half-bridge modules connected in parallel to a single output inductor and driven by a single pulse width modulation (PWM) signal. According to certain aspects, each high-side driver and low-side driver in a single half-bridge module is synchronized in their switching with corresponding high-side drivers and low-side drivers in other half-bridge modules.

20 Claims, 9 Drawing Sheets

PARALLEL SYNCHRONIZED OPERATION FOR A HALF-BRIDGE CONFIGURATION IN A SWITCH MODE POWER SUPPLY

CROSS-REFERENCE TO RELATED PATENT APPLICATIONS

This application claims priority from U.S. Provisional Application No. 62/821,335, filed Mar. 20, 2019, the contents of which are incorporated herein by reference in their entirety.

TECHNICAL FIELD

The present embodiments relate generally to power management, power electronics, and industrial power products.

BACKGROUND

Many applications—such as electric vehicles, home appliances, industrial motor drives and more—require high power to operate, and thus incorporate a switch mode power supply (SMPS). Typically the SMPSs for high power applications include transistors as power switches which are capable of handling very high voltages (e.g. over 100 volts) and very high switching speeds (e.g. in nanoseconds) in various configurations. Some popular transistor configurations for such devices include half-bridge or full-bridge. However, limiting power loss and increasing switching efficiency is always challenging in such configurations.

SUMMARY

One or more embodiments relate to a circuit that can be used to prevent cross conduction in an SMPS including multiple half-bridge modules connected in parallel to a single output inductor and driven by a single pulse width modulation (PWM) signal. According to certain aspects, each high-side driver and low-side driver in a single half-bridge module is synchronized in their switching with corresponding high-side drivers and low-side drivers in other half-bridge modules.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

Figure 1:
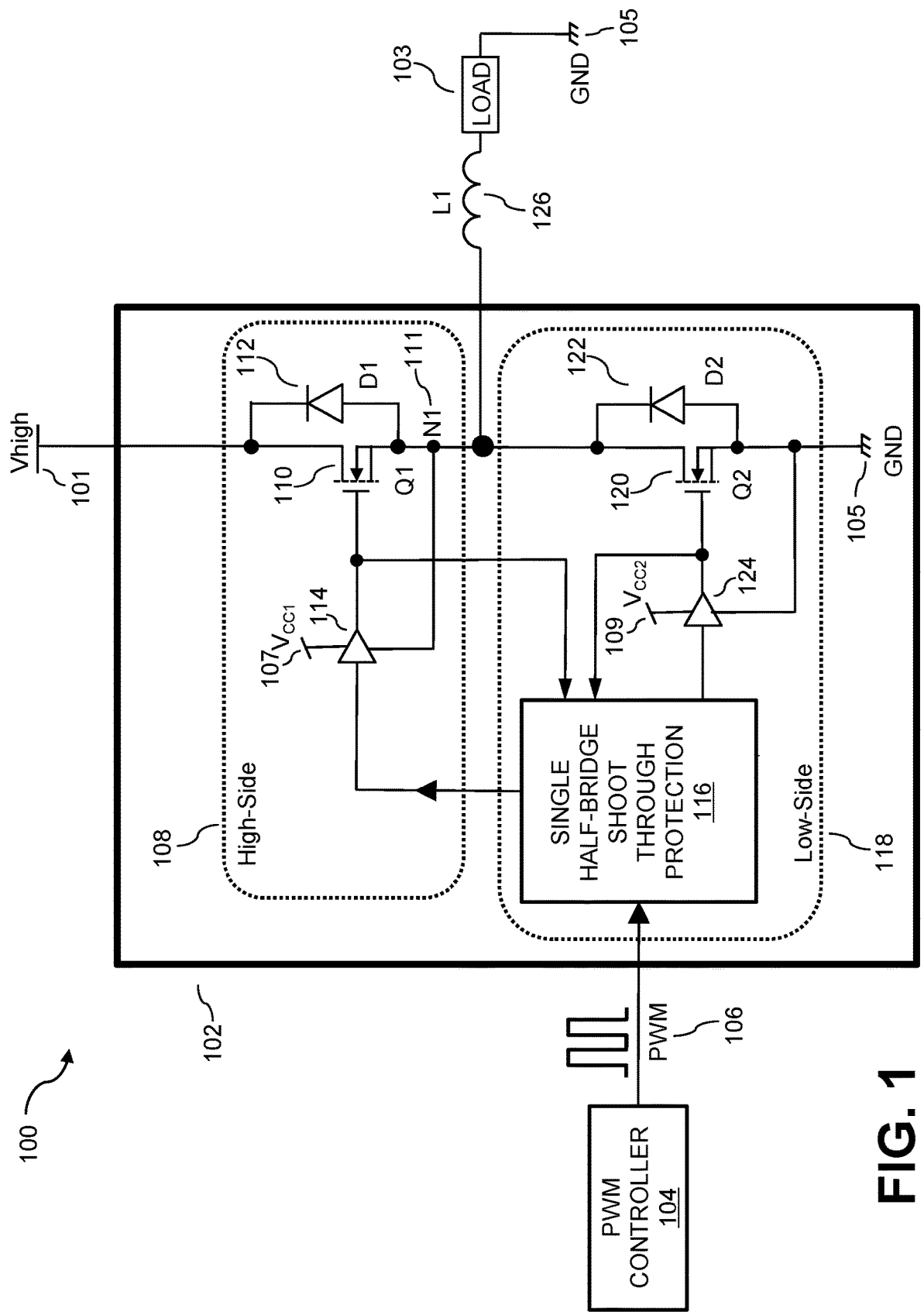
FIG. 1 is a diagram illustrating a standard configuration 100 of a switch mode power supply including a single half-bridge module.

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain aspects, the present Applicant recognizes that in multiple bridge configurations, the various switching modules have various speeds owing to the different inherent propagation delays of the passive and active electronic devices included therein. Therefore, even when they are controlled by the same PWM controller, the switches and the drivers in the different modules do not turn on and turn off simultaneously.

A switch mode power supply (SMPS) in a half-bridge configuration typically includes a high-side (HS) switch and a low-side (LS) switch connected in a cascaded fashion between a positive high voltage and a return voltage, also referred to as "ground". The HS and the LS may be referred to as opposite sides. The HS switch is driven via a HS driver and the LS switch is driven via a LS driver; both of which are which are turned on and off alternately by a pulse width modulator. The switches are typically MOSFETs but can be any other transistors or circuit elements that can be configured as an electronic switch. If both the MOSFETs are turned on even for a very short time, then a large current can flow from the HS to the LS which can damage the circuit.

In order to avoid this situation, switch mode power converters with a half-bridge configuration typically include a shoot through protection circuit, also referred to as an overlap protection circuit or a cross conduction prevention circuit, to prevent a large penetration current through from the HS driver to the LS driver. The shoot through protection circuit monitors the ON to OFF state of a transient device such as gate to source driving voltage of the HS or LS MOSFETs and if the state remains ON, then it blocks the drive signal to turn ON the other device. However, in very high speed switching operations, even if the other driver's input is low, there is some transient time required for the MOSFET to change its state from on to off completely because of the driver's device delay time. Under this transient condition, if the cascade connected opposite side's driver becomes ON, then a huge penetration current can flow from Vcc to GND as a shoot through current.

Even though some existing types of shoot through protection circuits can substantially prevent the shoot through current in a single half bridge configuration, they cannot work in a configuration where multiple half bridge modules are connected in parallel. This is because module by module the protection timing can be different. For example, for a given module, the shoot through protection circuit for that particular module can ensure before turning on the LS driver that the HS driver is for that particular module is off; however, it cannot ensure that the HS driver in any other module is off. Similarly, the shoot through protection circuit for any given module can ensure before turning on the HS driver that the LS driver for that particular module is turned off. However, it cannot ensure that the LS driver in any other module is off. Therefore, a large shoot through current may occur among different modules. According to aspects of the present embodiments, therefore, to prevent the shoot through current among the modules, all the half-bridge modules need a parallel synchronizing circuit to check the ON or OFF state of each HS and LS driver in each of the modules.

Embodiments of the present disclosure relate to a method and an apparatus for a parallel synchronizer or a synchronizing circuit for a multi-module half-bridge SMPS to prevent a shoot through current among and between a plurality of parallel-connected modules. As may be appreciated, each module has a HS driver input terminal and output terminal and a LS driver input and output terminal which indicate the driver's ON or OFF state. In the disclosed embodiment, the HS input terminals of all modules are combined or tied together; the HS output terminals of all modules are combined or tied together; the LS inputs of all modules are combined or tied together; and the LS output terminals of all modules are combined or tied together, using a wired logic. In one example, the wired logic can be a wired OR logic. In other examples, the wired logic can be a wired NOR logic. Furthermore, each module may have a HS sync-up terminal to which the combined HS driver terminals are connected and a LS sync-up terminal to which the combined LS driver terminals are connected.

As can be appreciated, in one example, due to the wired OR logic, for any given module, the HS driver will be turned off only when all of HS drivers are turned off. Even if any one of the HS drivers is on, then the HS driver in the instant module will also be on. Further, upon sensing that the HS driver is on, the shoot through protection circuit for the instant module will not allow the LS driver to be turned on; and vice versa. As such the parallel synchronizer can ensure before turning on any HS driver in any module that the LS driver in that particular module as well the LS drivers in all the remaining modules are off; and vice versa.

In one example, each individual half-bridge module having a HS driver and a LS driver may be coupled to output their state to the parallel synchronizer as ON or OFF. Furthermore, in one example, each individual half-bridge module is coupled to sense via the parallel synchronizer, a combined state of all the HS drivers, a combined state of all LS drivers; and change the state of its own HS driver and the LS driver accordingly.

In this manner, the disclosed parallel synchronizer and corresponding embodiments ensure that for any given module before the LS driver is turned on, all the HS drivers are OFF; and once all the HS drivers are off then the LS driver is turned on. Similarly, the parallel synchronizer can ensure before a HS driver is turned on, that all the LS drivers are OFF; and once all the LS drivers are off then the HS driver is turned on. It may be appreciated that since various half bridge modules may operate at slightly different speeds owing to the electrical characteristics of device therein and ambient conditions. Therefore, the HS and LS drivers from various modules may turn on and off at different speeds. It can be appreciated by those skilled in the art that all the HS drivers may be considered to be off when the slowest HS driver is off and all the LS drivers may be considered to be off when the slowest LS driver is off. As such in one example, the parallel synchronizer is configured to work on an off state priority means the slower device has priority. In other words, a HS driver in any module may be turned on when the slowest LS driver is off; and a LS driver in any module may be turned on when the slowest HS driver is off. As such, all the HS drivers are turned on at the same instant when the slowest LS driver is off; and all the LS drivers are turned on at the same instant when the slowest HS driver is off. In other words, all the HS drivers and the high drivers are turned on synchronously.

In some other examples, the HS and the LS drivers may be turned off synchronously. In yet another example, the HS and the LS drivers may be turned off or turned on synchronously.

Advantageously, the parallel synchronized shoot through protection circuit works with all parallel connected half-bridge modules even at high speeds. It may be appreciated that parallel connected modules as will be disclosed may be especially suitable and useful where each half bridge module includes a light load driver or a smaller driver. The reason for this is as smaller drivers are associated smaller capacitances, those can be easily configured to operate synchronously at higher speeds. The disclosed circuit also provides a better thermal design for module heat spreading. It also features an easy PCB design with a lower current density.

In the example of a wired NOR logic, each module's HS sync-up terminal may receive an open drain output of all the HS driver and the LS synch-up terminal may receive an open drain output of the LS driver. The HS terminals are connected together then work as "Wired NOR". As long as at least one driver is in an ON state, the NOR logic maintains a low level and keeps the other driver in the OFF state. When all the drivers are off then the NOR logic level changes the logic level to high thereby releasing an ON signal to the opposite driver. This function ensures the safe operation for parallel connection Half-Bridge modules.

In a wired OR logic, the combined state of all the HS drivers is ON even if one of the HS drivers is ON; and upon sensing that, the corresponding shoot through prevention circuit in a half-bridge module will prevent the corresponding LS driver from turning ON. Or in other words, the shoot through prevention circuit will inhibit the turning on of the corresponding LS driver. Similarly, in a wired OR logic, the combined state of all the LS drivers is ON even if one of the LS drivers is ON; and upon that the corresponding shoot through prevention circuit will prevent the corresponding HS driver from turning ON. Or in other words, the shoot through prevention circuit will inhibit the turning on of the corresponding LS driver.

In a wired NOR logic, the combined state of all the HS drivers is OFF even if one of the HS drivers is ON; and upon sensing that, the corresponding shoot through prevention circuit will keep the corresponding HS driver OFF or prevent it from turning ON; or in other words, the shoot through prevention circuit will inhibit the turning on of the corresponding LS driver. Similarly, in a wired NOR logic, the combined state of all the LS drivers is OFF even if one of the LS drivers is ON; and upon sensing that the corresponding shoot through prevention circuit will keep the corresponding HS driver OFF or will prevent it from turning ON; or in other words, the shoot through prevention circuit will inhibit the turning on of the corresponding LS driver.

In a typical configuration, a plurality of parallel half-bridge modules can be connected to receive a common PWM sync signal, a common HS sync input, and a common LS sync input, and a common output to drive an inductive load. It should also be noted that the disclosed configuration is a multi-purpose configuration. It can be implanted in an ac-dc converter or a dc-dc converter. A typical application can be in a motor driver.

FIG. 1 is a diagram illustrating a standard configuration 100 of a switch mode power supply including a single half-bridge module 102, a PWM controller 104, an inductor L1 126, and a load 103. The half-bridge module 102 further includes a HS unit 108 and a LS unit 118. The HS unit 108 further includes a transistor Q1 110 and a HS driver 114. The LS unit 108 further includes a transistor Q2 120, a diode D2 122, a LS driver 124, and a single half-bridge shoot-through protection unit 116. The diodes D1 112 and D2 122 represent the body diodes of the transistors Q1 110 and Q2 120. When Q1 110 is on, Q2 120 is off and when Q2 120 is on, Q1 110 is off. The drain terminal of Q1 110 is coupled to the positive high voltage Vhigh 101 and the source terminal of the Q1 110 is coupled to the drain of Q2 120. Furthermore, the source terminal of the Q2 120 is coupled to an electrical ground GND 105. The transistor Q110 is driven by the HS driver 114 and the transistor Q2 120 is driven by the LS driver 124. The driver 124 is coupled between a voltage Vcc2 and ground GND 105. In one example, the Vcc2 12V. The driver 114 is coupled between a voltage Vcc1 and a node N1 111 which is the source terminal of the transistor Q1 110 and a drain terminal of the transistor Q2 120. Therefore, as can be appreciated, the voltage Vcc1 may be equal to voltage at the node N1 111 plus 12V.

The PWM controller 104 is coupled to provide a signal PWM 106 to the half-bridge module 100 to turn the transistors Q1 110 and Q2 120 on and off alternately. The signal PWM 106 is received by the single half-bridge shoot-through protection unit 116 which in turn the drivers 114 and 124 on or off. It may be noted that the unit 116 is designed and configured to ensure that there is no overlap between the turning on of the transistors Q1 110 and Q2 120. It may be appreciated by those skilled in the art that the configuration 100 is for a step down converter and hence the load 103 is connected between the inductor L1 126, however, in other configurations, the load may be connected in a different way. For example, for a step up converter configuration, the load 103 may be swapped with the Vhigh 101.

Figure 2:
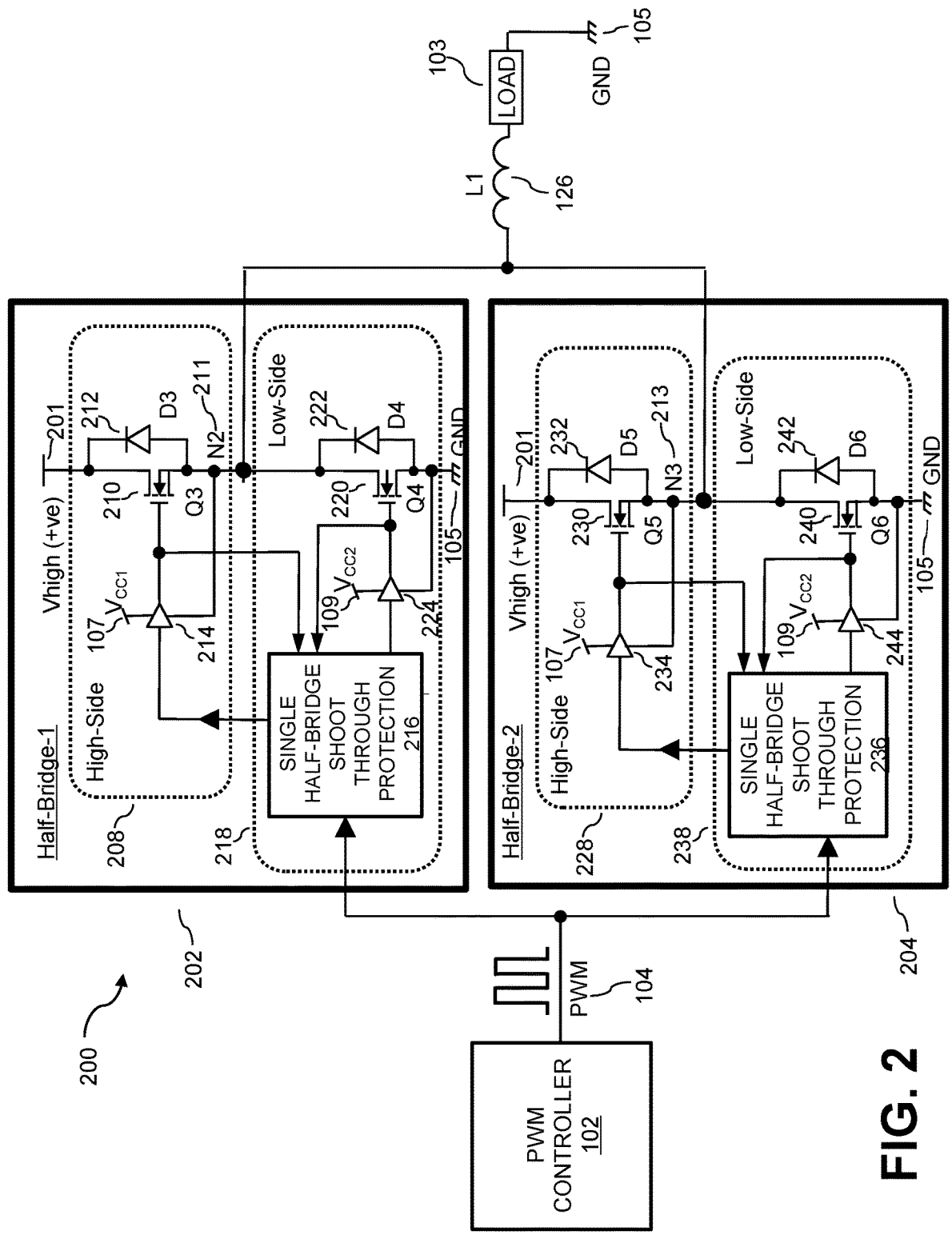
FIG. 2 is a diagram illustrating a standard configuration 200 of a switch mode power supply including multiple half-bridge modules.

FIG. 2 is a diagram illustrating a portion of a standard configuration 200 of a switch mode power supply including multiple half-bridge modules. As can be seen, the configuration 200 includes two half-bridge modules half-bridge-1 202 and half-bridge-2 204. The configuration 200 shares many common features and circuit elements with configuration 100 such as the PWM controller 102 and the inductor L1 126 which are coupled in a similar fashion to the half-bridge modules half-bridge-1 and half-bridge-2. As can be seen, the half-bridge-1 and half-bridge-2 are connected in a parallel arrangement between the PWM controller 102 and the inductor L1 126. The half-bridge-1 and half-bridge-2 both can examples of the half-bridge module 102 shown in FIG. 1. The half-bridge module 202 includes a HS unit 208 comprising a transistor Q3 210 with a body diode D3 212, a HS driver 214; and a LS unit 218 comprising a transistor Q4 220 with a body diode D4 222, a LS driver 224, and a single half-bridge shoot-through protection module 216. Similar to the node N1 111 in FIG. 1, a node N2 211 is a common node between the transistors Q3 210 and Q4 220; and a node N3 213 is a common node between the transistors Q5 230 and Q6 240.

Similarly, the half-bridge module 204 includes a HS unit 228 comprising a transistor Q5 230 with a body diode D5 232, a HS driver 234; and a LS unit 238 comprising a transistor Q6 240 with a body diode D6 242, a LS driver 244, and a single half-bridge shoot-through protection module 236. Both the halfalf-bridge-1 and half-bridge-2 are coupled between a positive high voltage Vhigh (+ve) 201 and the ground voltage GND 105.

Since both half-bridge-1 and half-bridge-2 are connected in parallel, the signal PWM 104 is received by both single bridge shoot through protection modules 216 and 236. As can be appreciated by those skilled in the art, the PWM signal 104 is configured to simultaneously turn on or off both HS drivers 214 and 224 which results in the transistors Q3 210 and Q5 230 being turned on and off simultaneously as well.

Similarly the PWM signal 104 is configured to simultaneously turn on or off both the LS drivers 224 and 244 which results in the transistors Q3 210 and Q5 230 being turned on and off simultaneously as well.

As explained earlier, in the half-bridge module 202, the shoot-through protection circuits 216 is configured to ensure that the LS driver 224 is off before turning on the HS driver 214 is turned on and vice versa. However, there is no way for the shoot-through protection circuit 216 to sense the on or off state of the HS driver of the other half-bridge module 204. Therefore, it may turn on the LS driver 224 even when the HS drive 234 of the other module B is on; and vice versa.

Similarly, in the half-bridge module 204, the shoot-through protection circuits 236 is configured to ensure that the LS driver 244 is off before turning on the HS driver 234 is turned on and vice versa. However, there is no way for the shoot-through protection circuit 236 to sense the on or off state of the HS driver of the other half-bridge module 202. Therefore, it may turn on the LS driver 224 even when the HS drive 214 of the other module 202 is on; and vice versa. In general, the existing multiple half-bridge module configuration has the drawback that any side's (high or low) driver in a half-bridge module may be turned on when the opposite side's driver from another module is on. This may result in a very large current being flown between the positive high voltage and the ground and even damage the power supply.

Figure 3:
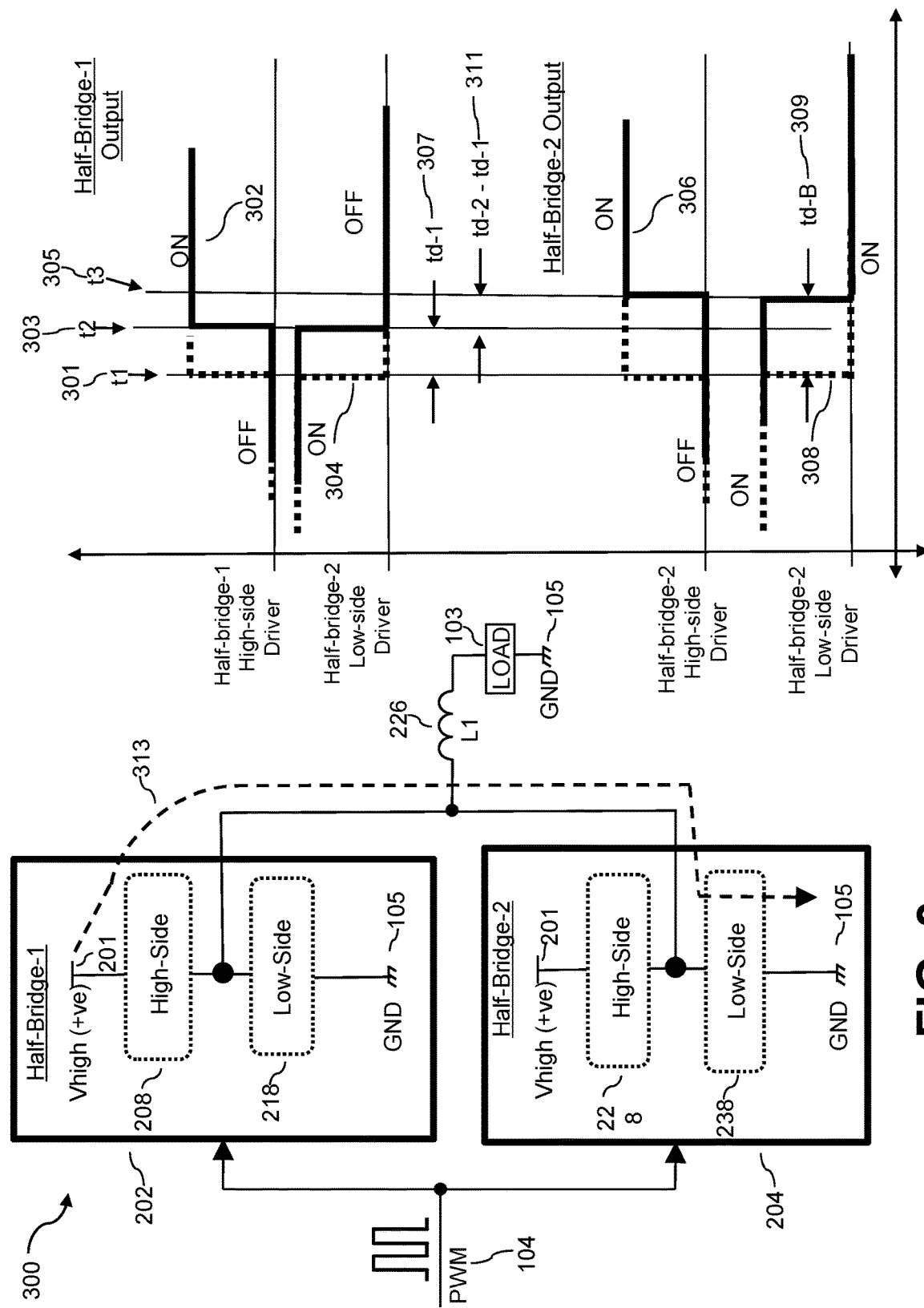
FIG. 3 is a diagram illustrating example output waveforms for the half-bridge modules of FIG. 2.

FIG. 3 is a diagram illustrating example output waveforms for the existing half-bridge modules half-bridge-1 and half-bridge-2 in the configuration 200 of FIG. 2. More particularly, the waveforms in FIG. 3 illustrate a problem in the existing type of parallel half-bridge configurations when half-bridge 202 is faster than the half-bridge 204.

The waveforms 302, 304 illustrate the output of the half-bridge 202 and the waveforms 306, 308 illustrate the output of the half-bridge 204. More particularly, the waveform 302 illustrates the state of the HS driver 214 as on or off; and the waveform 304 illustrates a state of the LS driver 224 as on or off. Similarly, the waveform 306 illustrates the state of the HS driver 234 as on or off; and the waveform 308 illustrates a state of the LS driver 244 as on or off.

It may be assumed that at time t1 301, both the HS drivers 214 and 234 receive a turn on signal from the PWM controller 102 and both the LS drivers 224 and 244 may receive a turn off signal from the PWM controller 102. However, due to their different inherent propagation delays they may be turned on at different times. The half-bridge 202's HS driver 214 is turned on and the LS driver 224 is turned off at time t2 303 after a propagation delay td-A 307. Similarly, the half-bridge 204's HS driver 234 is turned on LS driver 244 is turned off at time t3 305 after a propagation delay td-B 309. As such the half-bridge 202 is faster than the half-bridge 204.

However, during the time t2 303 and t3 305, when the half-bridge 204's LS driver 244 is still on, the half-bridge 202's HS driver 214 is already turned on. Therefore, during the time t2 304 and t3 305, a large current can flow through the power supply from the HS unit 208 of the half-bridge 202 to the LS unit 238 of the half-bridge 204 as illustrated by the arrow 313. This is a case when half-bridge 204 is slower than the half-bridge 202. In general, the time during t2 303 and t3 305 can be considered as the propagation delay from half-bridge 204 to half-bridge 202 which is illustrated by td-2-td-1 311.

Figure 4:
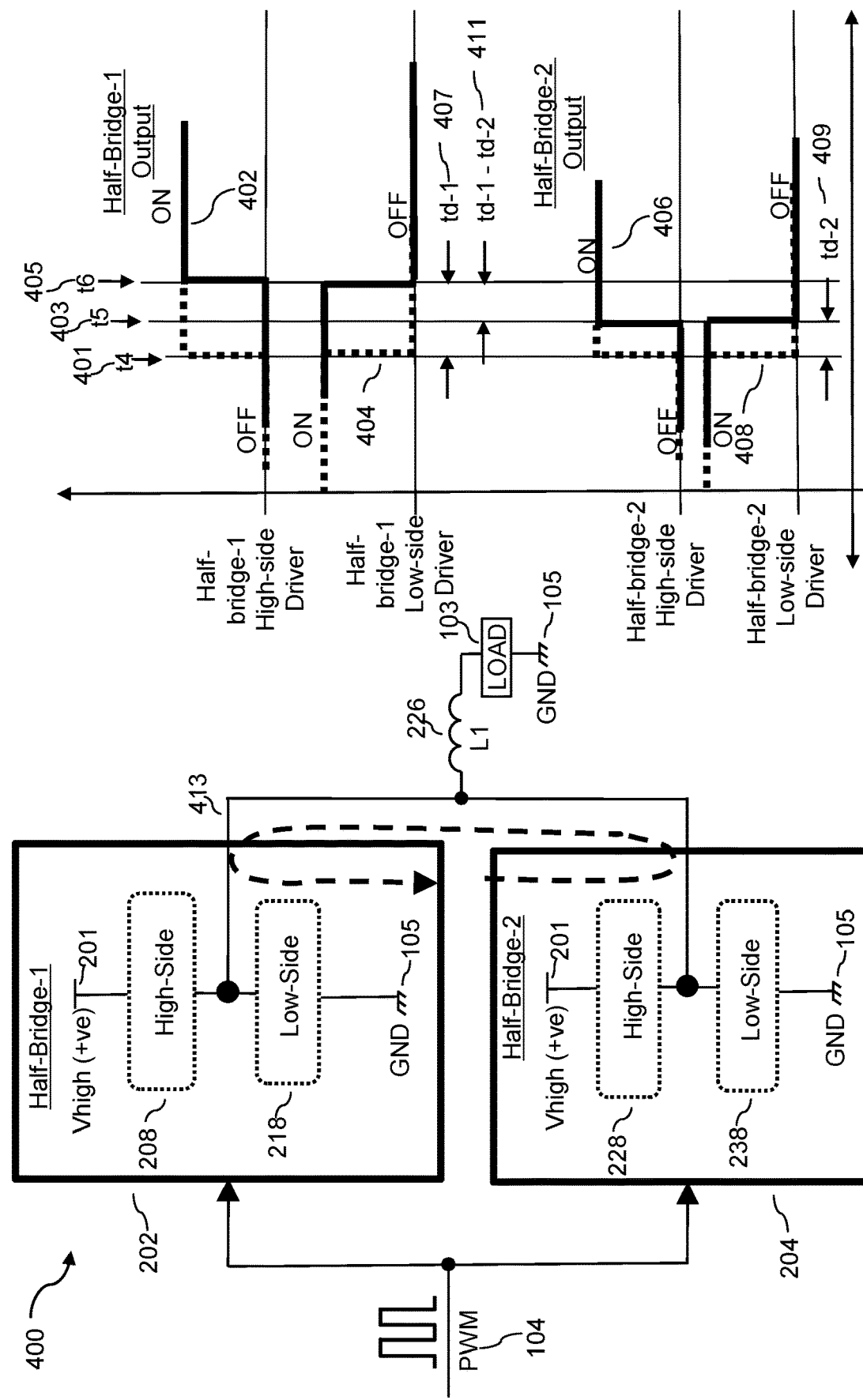
FIG. 4 is a diagram illustrating another example output waveforms for the half-bridge modules of FIG. 2.

FIG. 4 is a diagram illustrating another example output waveforms for the existing half-bridge modules half-bridge-1 and half-bridge-2 in the configuration 200 of FIG. 2. More particularly, the waveforms in FIG. 4 illustrate a problem in the existing type of parallel half-bridge configurations when half-bridge-1 202 is slower than the half-bridge-2 204.

The waveforms 402, 404 illustrate the output of the half-bridge 202 and the waveforms 406, 408 illustrate the output of the half-bridge 204. More particularly, the waveform 402 illustrates the state of the HS driver 214 as on or off; and the waveform 404 illustrates a state of the LS driver 224 as on or off. Similarly, the waveform 406 illustrates the state of the HS driver 234 as on or off; and the waveform 408 illustrates a state of the LS driver 244 as on or off.

It may be assumed that at time t4 401, both the HS drivers 214 and 234 receive a turn on signal from the PWM controller 102 and both the LS drivers 224 and 244 may receive a turn off signal from the PWM controller 102. However, due to their different inherent propagation delays they may be turned on at different times. The half-bridge 204's HS driver 234 is turned on and the LS driver 244 is turned off at time t5 403 after a propagation delay td-B 409. Similarly, the half-bridge 202's HS driver 214 is turned on and the LS driver 234 is turned off at time t6 405 after a propagation delay td-A 307. As such the half-bridge 202 is slower than the half-bridge 204.

However, during the time t5 403 and t6 405, when the half-bridge 202's LS driver 224 is still on, the half-bridge 204's HS driver 234 is already turned on. Therefore, during the time t5 403 and t6 405, a large current can flow through the power supply from the HS unit 228 of the half-bridge 204 to the LS unit 218 of the half-bridge 202 as illustrated by the arrow 413. This is a case when half-bridge 204 is faster than the half-bridge 202. In general, the time during t5 403 and t6 405 can be considered as the propagation delay from half-bridge 204 to half-bridge 202 which is illustrated by td-1-td-2 411.

Figure 5:
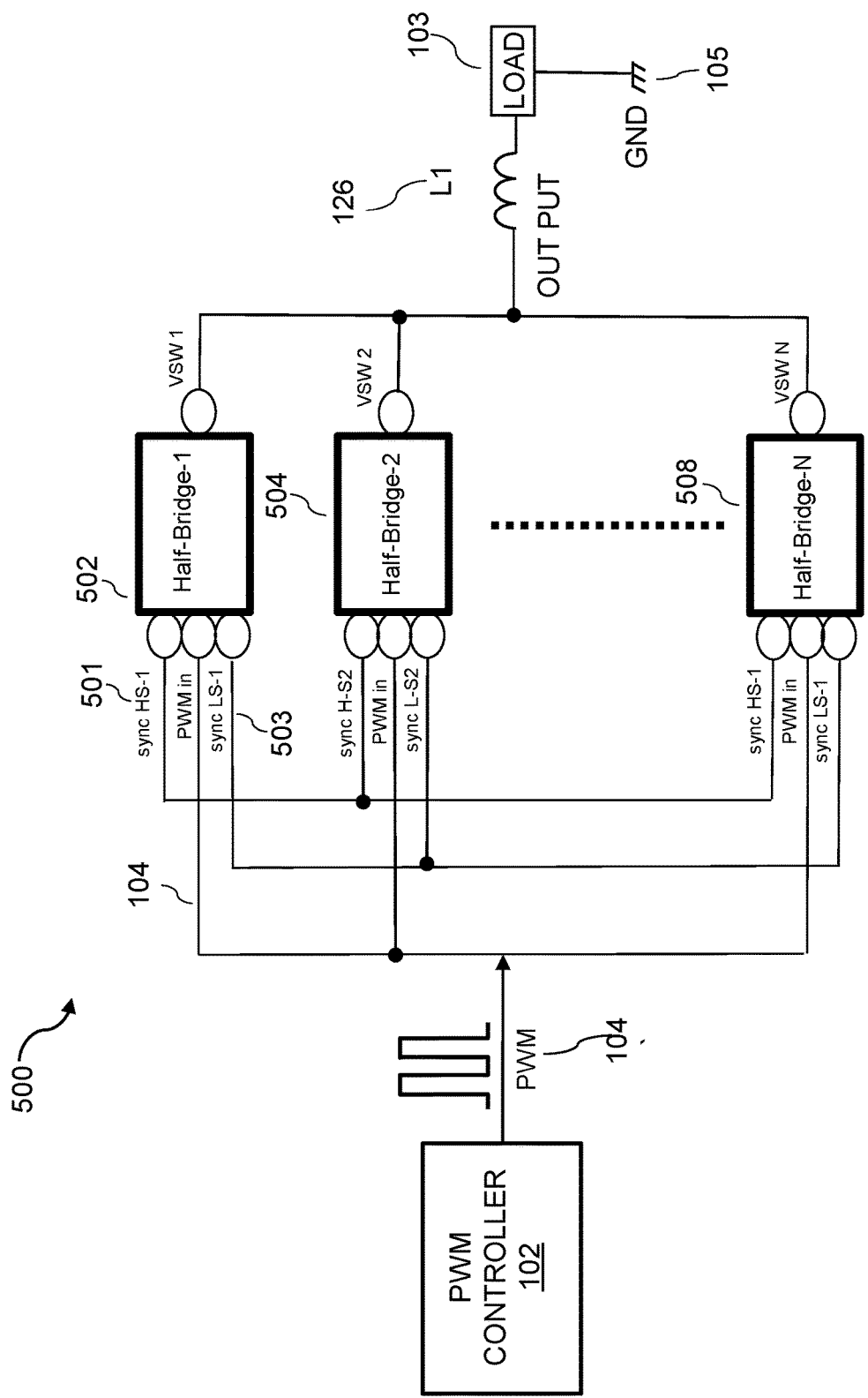
FIG. 5 illustrates an example configuration with a plurality of half-bridge modules, according to an embodiment of the present disclosure.

FIG. 5 illustrates an example configuration 500 with a plurality of half-bridge modules, according to an embodiment of the present disclosure. The configuration 500 includes a plurality of half-bridge modules half-bridge-1 502, half-bridge-2 504 up to half-bridge-N 508 coupled in a parallel fashion, where N can be any integer number as per the design. In one example, according to reasonable design considerations, the maximum value of N can be twenty. More details about this will be explained later in the specification. All the half-bridge modules are coupled to receive the PWM signal 104 by the PWM controller 102.

In accordance with an embodiment, each individual half-bridge module comprises a parallel synchronizer the details of which will be provided below. Each half-bridge module includes a HS synchronization (sync) terminal 501 (shown as sync HS-1, sync HS-2, up to sync HS-N) and a LS synchronization (sync) terminal 503 (shown as sync LS-1, synch LS-2, up to sync LS-N). In other words each half-bridge module is coupled to receive a HS sync signal synch HS-1 and a LS sync signal. Each HS synch terminal also indicates an on or off state of its corresponding HS driver and each LS synch terminal indicates an on or off state of its corresponding LS driver.

All the HS sync terminals from all the half-bridge modules are coupled together by a wired configuration such as wired OR or wired NOR or any suitable configuration; and all the synch LS sync terminals from all the half-bridge modules are coupled together by a wired configuration such as wired OR or wired NOR or any suitable one.

Due to the wired configuration, it may be appreciated that the HS synch terminal for each individual half-bridge module reflects or is configured to indicate a combined state of all the HS drivers; and the LS synch terminal for each individual half-bridge module reflects or is configured to indicate a combined state of all the LS drivers.

Depending on the wired logic used for coupling together the HS synch terminals, the combined state of the HS drivers reflected by those may be on or off. For example, if all the HS sync terminals are coupled together by a wired OR logic, then the combined state will on when any one of the HS drivers is on; and the combined state will be off when all of the HS drivers are off. Similarly depending on the wired logic used for coupling together the LS synch terminals, the combined state of the LS drivers reflected by those may be on or off. For example, if all the LS sync terminals are coupled together by a wired OR logic, then the combined state will be on when any one of the LS drivers is on; and the combined state will be off when all of the LS drivers are off.

As another example, if all the HS sync terminals are coupled together by a wired NOR logic, then the combined state will be off when any one of the HS drivers is on; and the combined state will be on when all of the HS drivers are off. Similarly if all the LS sync terminals are coupled together by a wired NOR logic, then the combined state will be off when any one of the LS drivers is on; and the combined state will be on when all of the LS drivers are off.

Each half-bridge module is also configured to generate an output signal VSW. In one example all the output signals from all the half-bridge modules (VSW-1, VSW-2, up to VSW-N) are coupled together as shown.

More specifically, each individual half-bridge module is configured to receive a combined state of all the HS drivers via the HS sync terminal and a combined state of all the LS drivers via the LS sync terminal; and further decide a desired state of the opposite side's driver (HS or LS driver) based on the combined state. The desired state of the opposite side's driver may further be used to turn the opposite side's driver on or off. In may be appreciated that in one example, the combined state of one side's drivers is opposite to the desired state of all opposite side's drivers.

For example, if it is assumed that all the HS synch terminals and LS sync terminals are coupled together by a wired OR logic, then by virtue of the wired OR logic, if any of the HS drivers is on, then the combined state of all the HS drivers will be on making the HS synch terminal of each individual half-bridge high. When the combined on state of all HS drivers is sensed by each individual half-bridge module, the desired state of the LS driver will be decided as off and the corresponding LS driver may then be turned off or may be prevented from turning on. As such a high value of the HS sync terminal can be used to turn the LS driver off and a low value of the HS sync terminal can be used to turn the LS driver on in each individual half-bridge module.

Similarly, if any of the LS drivers is on, then the combined state of all the LS drivers is on, making the LS synch terminal of each individual half-bridge high. When the combined ON state of all the LS drivers is sensed by each individual half-bridge module, the desired state of the HS driver will be decided as OFF and the corresponding HS driver may then be turned off or prevented from turning ON. As such a high value of the LS sync terminal can be used to turn the HS driver off and a low value of the LS sync terminal can be used to turn the HS driver on in each individual half-bridge module. In other examples, if a wired NOR logic is used to couple all the HS sync terminals, then the combined state may have a different value. Further details of an example implementation will be explained with respect to FIG. 6.

Figure 6:
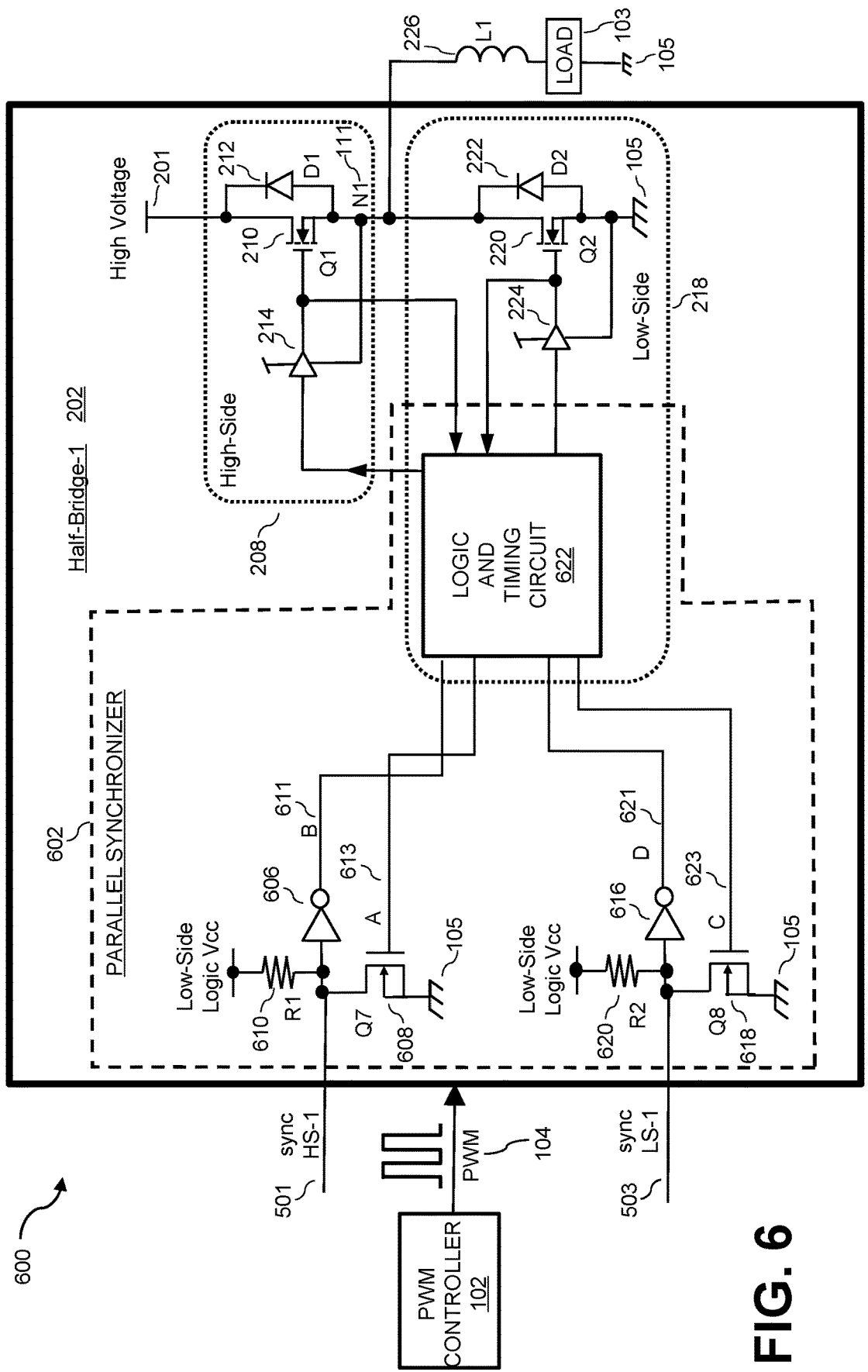
FIG. 6 illustrates an example circuit of a parallel synchronizer for a half-bridge module of FIG. 2, according to an embodiment of the present disclosure.

FIG. 6 illustrates an example implementation 600 of a parallel synchronizer 602 for a half-bridge module which can included in a multi-half-bridge configuration power supply, according to an embodiment of the present disclosure. Referring back to FIG. 5, each individual half-bridge module from half-bridge-1 up to half-bridge-n includes the parallel synchronizer 602. The parallel synchronizer, hereafter, synchronizer 602 can be integrated as part of the module 202. In some examples, it can also be implemented in a discrete fashion.

In one example, the synchronizer 602 is configured sense a combined state of all the HS drivers included in the multi-half-bridge configuration via the sync HS-1 terminal 501 and provide the same to the logic and timing circuit 622. Similarly, the synchronizer 602 is configured to sense a combined state of all the LS drivers via a sync-LS terminal 503 and provide the same to the logic and timing circuit 622.

In one example, the sync HS-1 501 and synch LS-1 503 are bi-directional terminals. When configured as inputs sync HS-1 501 and synch LS-1 503 are coupled to sense the combined state of all the HS drivers and all the LS drivers respectively. When configured as outputs sync HS-1 501 and synch LS-1 503 are coupled to output a state of the HS driver 214 and the LS driver 224 respectively. Typically, when the HS driver 214 is enabled to switch on the transistor Q1 210, then the synch HS-1 terminal will be configured as an output and the opposite side's driver, in this case, the LS driver 224 will be configured as an input.

The synchronizer 602 includes a logic and timing circuit 622, a resistor R1 610, an inverter 606, a HS pull-down transistor Q7 608, a resistor R2 620, an inverter 616, and a LS pull-down transistor Q8 618. The resistor R1 610, the inverter 606, and the HS pull-down transistor Q7 608 are collectively coupled to sense the sync-HS-1 terminal 501; and the resistor R2 620, the inverter 616, and the LS pull-down transistor Q8 618 are collectively coupled to sense the sync-LS-1 terminal 503. In some examples, the logic and timing circuit 622 can be combined with the LS driver 214.

As will be explained in more detail below, in one embodiment, before turning on the HS driver 214, the logic and timing circuit 622 senses the combined state of all the LS drivers via the sync LS-1 input 503. If the combined state of all LS drivers, also referred to as, a combined LSD state, is off, then it will allow the HS driver to be turned on. If the combined LSD state is on then the logic and timing circuit will turn off the HS driver 214 or prevent it from turning on.

Similarly, in one embodiment, before turning on the LS driver 224, the logic and timing circuit 622 senses the combined state of all the HS drivers via the sync HS-1 input 501. If the combined state of all HS drivers, also referred to as, a combined HSD state, is off, then it will allow the LS driver to be turned on. If the combined HSD state is on then the logic and timing circuit will turn off the LS driver 214 or prevent it from turning on.

Figure 7:
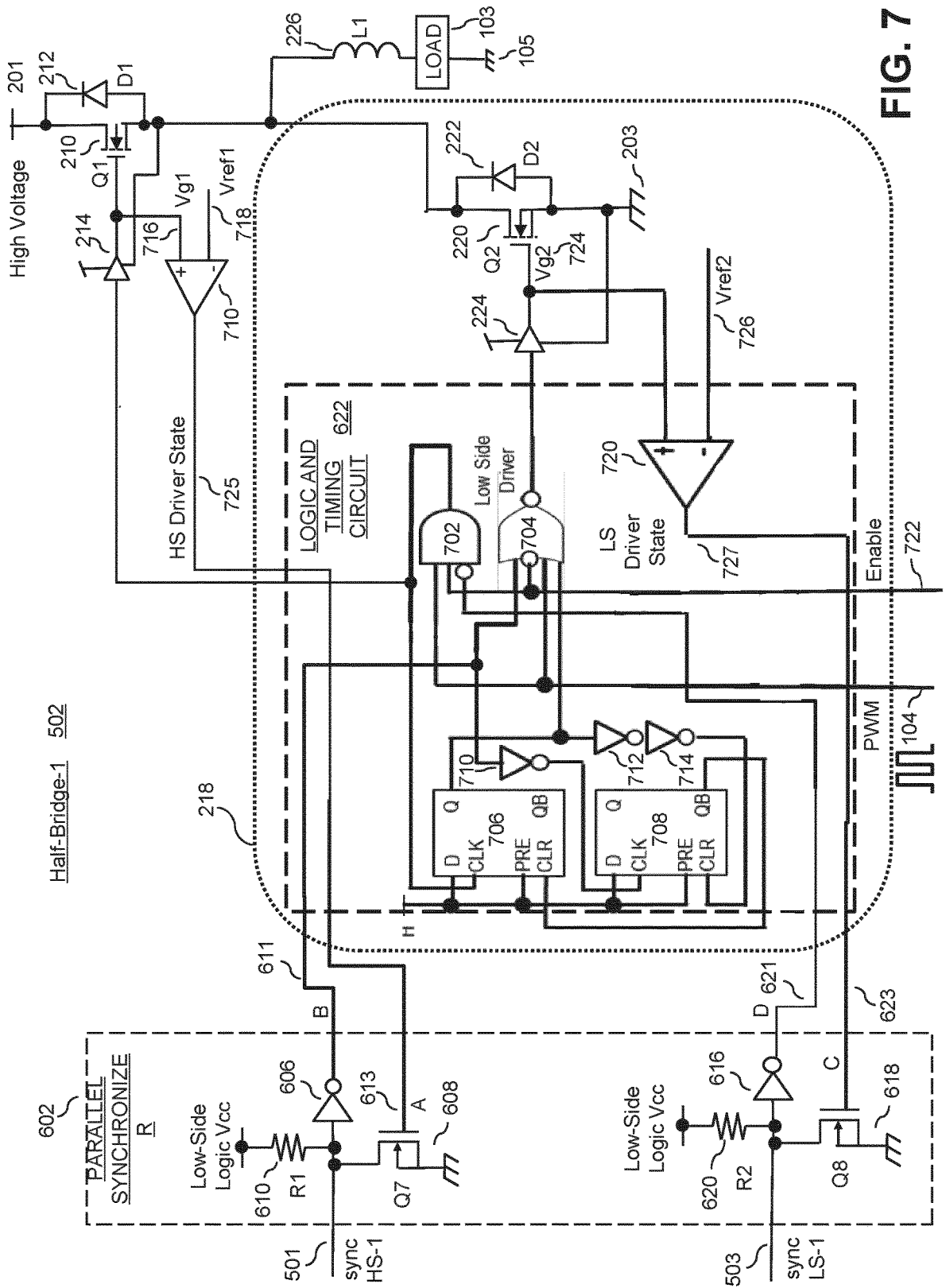
FIG. 7 is a diagram illustrating additional details of configuration of the parallel synchronizer to an example integrated driver circuit for a half-bridge module, according to an embodiment of the present disclosure.

FIG. 7 is a diagram illustrating additional details of configuring the parallel synchronizer 602 and the logic and timing circuit 622 for the half-bridge-1 module 202, according to an embodiment of the present disclosure. For the implementation 700, it may be assumed that the HS sync terminal 501 is combined with all the other HS synch terminals from all the other half-bridge modules are combined using a wired NOR configuration. Therefore, it may be understood that if any of the HS drivers in any of the half-bridge modules if on, then the HS synch terminal of that particular half-bridge module will be high; and owing to a NOR logic, the combined state of all the HS drivers will be HS sync terminal.

Referring back to FIG. 6, it may be understood that FIG. 7 illustrates example implementation details of the HS unit 208 including the HS driver 214 and the LS unit 218 including the LS driver 224 and their configuration with the logic and timing circuit as well as the parallel synchronizer 602.

The high side unit further includes a comparator 710 which is coupled to output a HS driver state signal 725 by comparing a gate voltage Vg1 716 of the transistor Q1 210 with a first reference voltage Vref1 718. The HS driver state signal 725 indicates an on or off state of the HS driver 214. When the HS driver 214 is on, the gate voltage Vg1 716 will begin to increase and once it is higher than the Vref1 718, the output of the comparator 710 will become high making the signal HS driver state 725 high. When the HS driver 214 is off, the gate voltage Vg1 716 will begin to decrease and once it is lower than the Vref1 718, the output of the comparator 710 will become low making the signal HS driver state 725 low.

Similarly, the LS unit 218 includes a comparator 720 which is coupled to output an LS driver state signal 727 by comparing a gate voltage Vg2 724 of the transistor Q2 220 with a second reference voltage Vref2 726. The LS driver state signal 725 indicates an on or off state of the LS driver 224. When the LS driver 224 is on, the gate voltage Vg2 724 will begin to increase and once it is higher than the Vref2 726, the output of the comparator 720 will become high which in turn will make the signal LS driver state signal 725 high. When the LS driver 224 is off, the gate voltage Vg2 724 will begin to decrease and once it is lower than the Vref2 726, the output of the comparator 720 will become low making the signal LS driver state signal 725 low. In other examples, there may be other logic used to sense and indicate the HS driver state or the LS driver state.

In one example, the comparators 710 and 722 can be part of the logic and timing circuit 622. In other examples, those can be separately implemented.

The HS driver 214 and the LS driver 224 are both coupled to the logic and timing circuit 622 and the parallel synchronizer 602. In one example, the logic and timing circuit 622 further includes an AND gate 702, a NOR gate 704, flip-flops or SR latches 706 and 708, and inverters 710, 712, 714.

It may be appreciated by those skilled in the art that the AND gate 702, the NOR gate 704, the flip-flops or SR latches 706, 708, the inverters 710, 712, 714, and the comparator 710 and 722 can form a logic portion of the logic and timing circuit 622; and the flip-flops or SR latches 706, 708 can form a timing portion of the logic and timing circuit 622.

In one example, if the HS driver state signal is high, then HS pull-down transistor Q7 608 is turned on, which will couple the terminal sync HS-1 501 to ground 203. If the HS driver state signal is low, then the HS pull-down transistor Q7 608 is turned off which will couple the terminal sync HS-1 501 to Vcc via the pull resistor R1 610.

Similarly, in one example, if the LS driver state signal is high, then the LS pull-down transistor Q8 618 is turned on which will couple the terminal sync LS-1 503 to ground 203. If the HS driver state signal is low, then HS pull-down transistor Q7 608 is turned off which will couple the terminal sync LS-1 503 to Vcc via the pull resistor R2 620.

As explained earlier, the sync HS-1 501 is coupled together with the other HS sync terminals of the other half-bridge modules and the sync LS-1 503 is coupled together with the other LS sync terminals of the other half-bridge modules. As such, the sync HS-1 501 and the LS-1 503 terminals will both indicate the states of the HS driver 214 and the LS driver 224 respectively. It may be appreciated that the sync HS-1 501 and synch LS-1 503 are thus configured to affect the combined HSD state or the combined LSD state respectively.

Additionally, the HS-1 501 and synch LS-1 503 terminals are also configured to be affected by other HS sync terminals LS terminals respectively as will be explained below.

If any of the other HS driver from any other half-bridge module is on, then the corresponding HS synch terminal will be on. In one example, by virtue of the wired NOR logic, the combined HSD state will then be low which in turn will make the synch HS-1 501 terminal low.

In one example, the input sync HS-1 501 can have a logic high value or a logic low value which is inverted by the inverter 606 to generate, an output B 611. The AND gate 702 and the NOR gate 704 are both coupled to receive the signal B 611. As explained earlier, since the HS synch terminals are coupled together using a NOR logic, if any of the HS drivers is ON then the combined state of all the HS drivers will be ON and the sync HS-1 501 terminal will be low making the signal B 611 high which in turn makes the output of the NOR gate 704 low. The output of the NOR gate 704 is coupled to enable or disable the LS driver 224. A high output of the NOR gate 704 enables the LS driver 224 and a low output of the NOR gate 704 disables the LS driver 224. Therefore a low value of the sync HS-1 501 will disable the LS driver 224 which will turn off the transistor Q2 220.

Similarly, in one example, the input sync LS-1 503 can have a logic high value or a logic low value which is inverted by the inverter 616 to generate, an output D 621. The AND gate 702 and the NOR gate 704 are both coupled to receive the signal D 621. As explained earlier, since the LS synch terminals are coupled together using a NOR logic, if any of the LS drivers is ON then the combined state of all the LS drivers will be ON and the sync LS-1 503 terminal will be low making the signal D 611 high which in turn makes the output of the NOR gate 704 low. A low output of the NOR gate 704 will disable the LS driver 224. Therefore a low value of the sync HS-1 501 will disable the LS driver 224 which will turn off the transistor Q2 220. As may be appreciated, when the transistor Q2 220 is off, the Vg2 will start decreasing and will make the output of the comparator 720 high, which further will disable the AND gate 702, which in turn will disable the HS driver 214.

In one example, upon receiving a positive PWM signal 104 and a positive enable signal 722, the logic and timing circuit 622 is configured to turn on the HS driver 214; and upon receiving a negative PWM signal 104 and a negative enable signal 722, the logic and timing circuit 622 is configured to turn on the LS driver 224. However, in accordance with an embodiment the logic and timing circuit is configured to ensure that the opposite side's drive is off before turning on any side's driver. This feature is implemented as follows. The AND gate 702 and the NOR 704 are both configured to turn on the HS driver upon receiving a positive PWM 104 and a positive enable signal 722; and to turn on the LS driver upon receiving a negative PWM 104 and a negative enable signal 722.

Upon receiving a positive PWM signal 104 and a positive enable signal 722, the logic and timing circuit 622 may continue to sense the value of the sync HS-1 501 terminal. If the HS-1 501 terminal is high indicating due to NOR logic that the combined HSD state is low meaning that no HS driver in any of the half-bridge modules is on, then the value of signal B 611 will be low. At this time if other inputs PWM 104 and enable signal 722 are also, zero, then the output of the NOR gate 704 will be high turning on the LS driver 224.

Similarly, upon receiving a negative PWM signal 104 and a negative enable signal 722, the logic and timing circuit 622 may continue to sense the value of the sync LS-1 503 terminal. If the synch LS-1 503 terminal is low indicating due to NOR logic that the combined LSD state is high meaning that at least one LS driver in any of the half-bridge modules is on, then the value of signal D 621 will be high. At this time, the output of the NOR gate 704 will be low turning off the LS driver 224. The on state of the LS driver 224 will make the output of the comparator high which will disable the AND gate 702 which will further disable the HS driver 214. Some other circuitry along with the AND gate 702 can turn the HS driver 214 on.

Those skilled in the art will be able to appreciate that as such the logic and timing circuit 622 is configured to synchronize the turning on an off of all the HS drivers and all the LS drivers. Briefly referring back to FIG. 5, a maximum value of N which is the number of half-bridge modules connected in parallel can be decided by Q7 or Q8 N-channel MOSFET pull-down drive ability.

Figure 8:
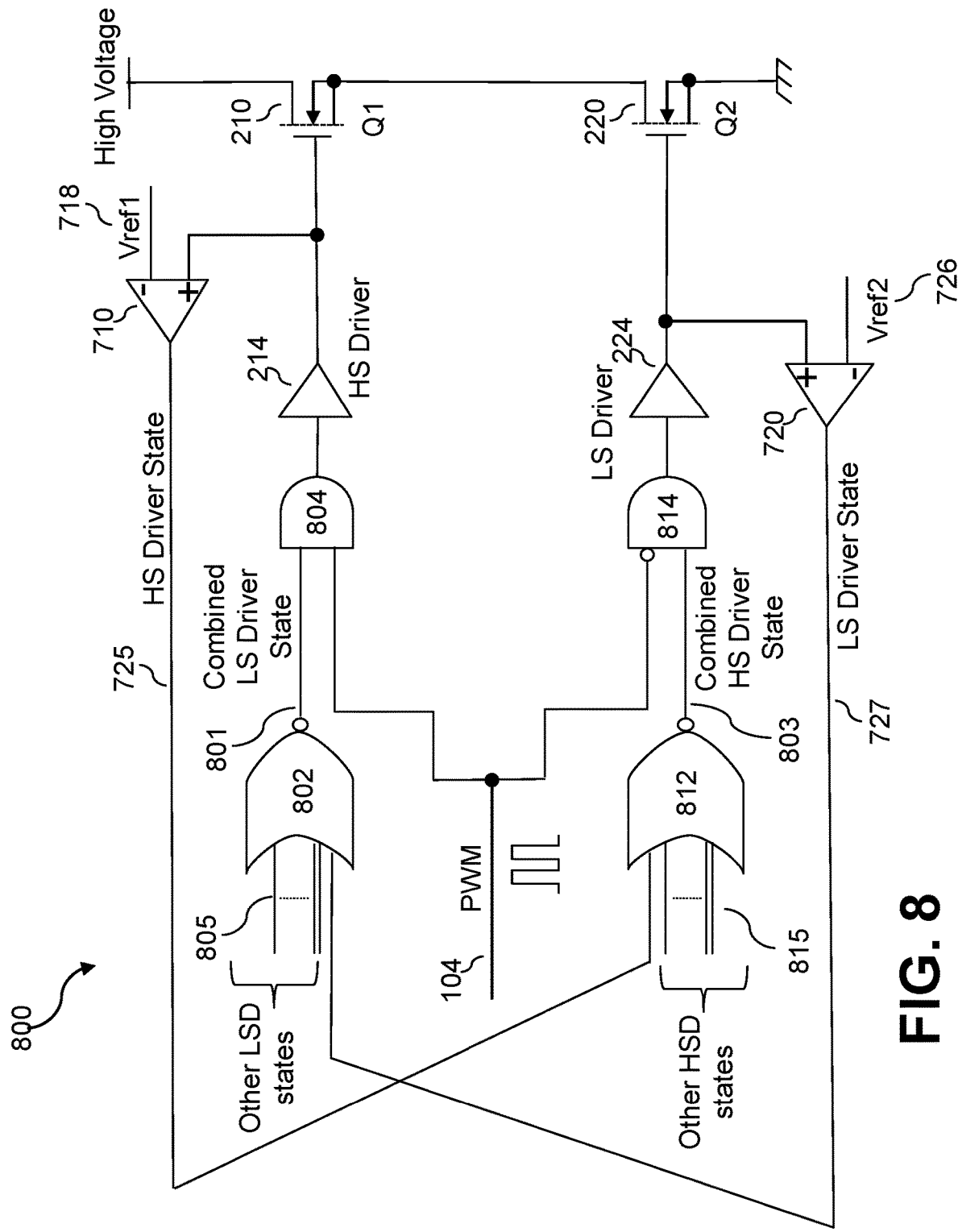
FIG. 8 illustrates an example logic implementation for the parallel synchronizer, according to an embodiment of the present disclosure.

FIG. 8 illustrates an example logic implementation 800 which is equivalent to the implementation shown in FIG. 7, and which can be included in each of the half-bridge modules connected in parallel. FIG. 8 includes the HS driver 214 configured to drive the HS transistor Q1 210 and the LS driver 224 is configured to drive the LS transistor Q2 220. FIG. 8 further includes the comparators 710 and 720 configured to indicate the state of HS driver 214 via the HS driver state signal 725 and the state of the LS driver 224 via the LS driver state signal 727 respectively as explained earlier with respect to FIG. 7. Further included in FIG. 8 are AND gates 804 and 814 and NOR gates 802 and 812. The HS driver state signal 725 is coupled to the gate A 613 of the transistor Q7 608. The NOR gate 812 is also coupled to receive states of all the other HS drivers 815 from all the other half-bridge modules.

Similarly, the LS driver state signal 727 is coupled to the gate C 623 of the transistor Q8 618. The NOR gate 802 is also coupled to receive states of all the other LS drivers 805 from all the other half-bridge modules. The HS driver 214 is enabled by the AND gate 804 and the LS driver 224 is enabled by the AND gate 814. The PWM signal 104 is coupled to a first input of the AND gates 804 and 814. As can be seen, a second input of the AND gate 804 is coupled to receive the combined LS drivers state 801 via the NOR gate 802. A second input of the AND gate 814 is coupled to receive the combined HS drivers state 814 via the NOR gate 812. As can be appreciated by those skilled in the art, the output of the NOR gate 802 will be low if any of its inputs is high; in other words, the output of the NOR gate 802 will be low if any of the LS drives is on. A low output of the NOR gate 802 will disable the AND 804 which will further prevent the HS driver 214 from turning on. Furthermore, the AND gate 804 will turn on the HS driver 214 when all the LS drivers are off.

Similarly, the output of the NOR gate 812 will be low if any of its inputs is high; in other words, the output of the NOR gate 812 will be low if any of the HS drives is on. A low output of the NOR gate 812 will disable the AND 814 which will further prevent the LS driver 224 from turning on. Furthermore, the AND gate 814 will turn on the LS driver 224 when all the HS drivers are off. As such it can be made sure that no HS driver and LS driver are on at the same time, which can help avoid shoot through current between any two half-bridge modules.

There may also be additional timing circuit configured to function with the logic circuit shown in FIG. 8. The timing circuit can be configured to synchronize the turning on and turning off of the HS drivers and the LS drivers along with the PWM signal 104.

In the above specification, the terms "power converter" and "power supply" may be used interchangeably to mean the same thing. The terms "coupled to", "configured to", "operable to" may be used interchangeably to mean the same thing.

Figure 9:
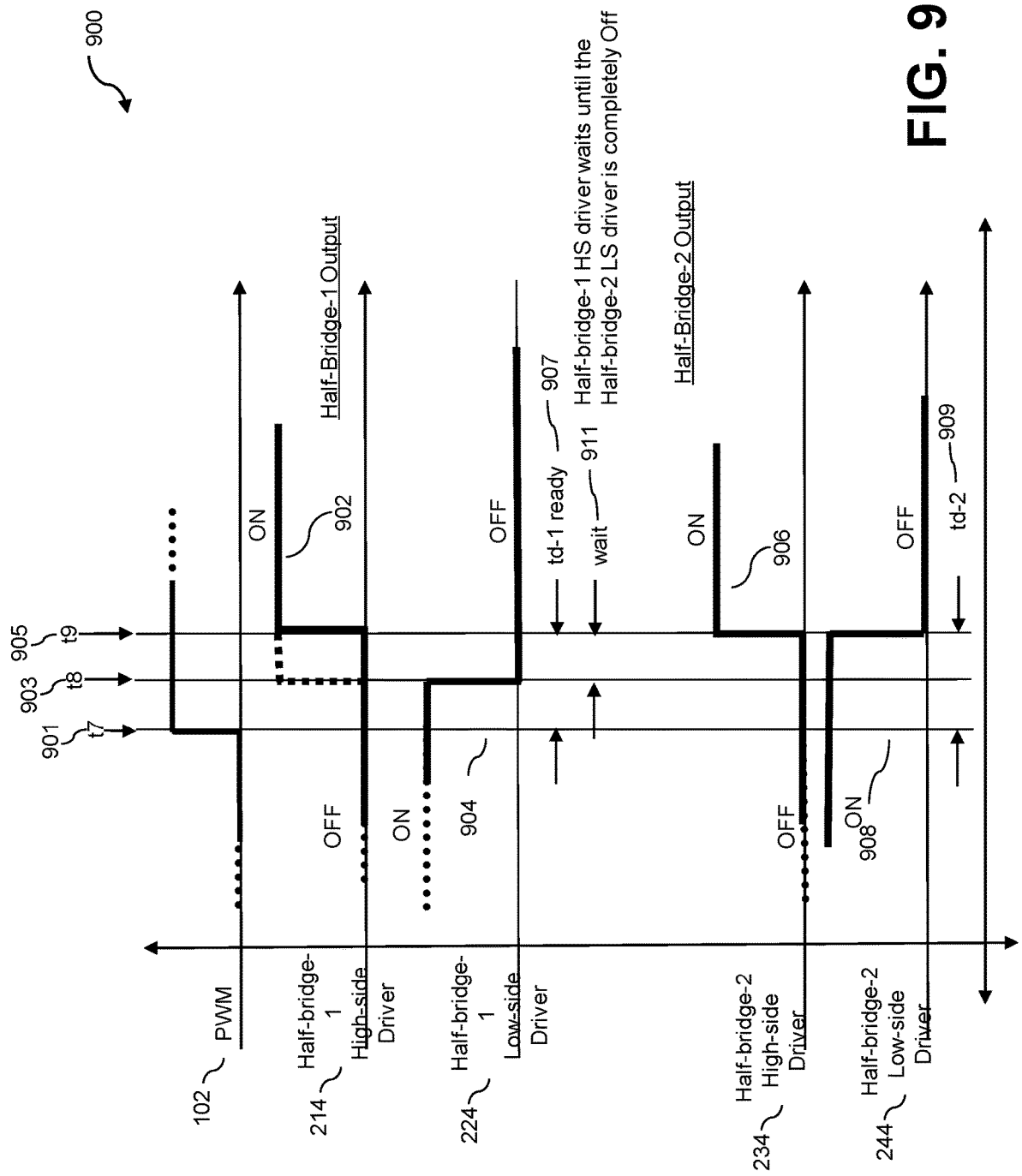
FIG. 9 is a diagram illustrating example output waveforms for multiple half-bridge modules connected in parallel and including a parallel synchronizer, according to an embodiment of the present disclosure.

FIG. 9 is a diagram illustrating example output waveforms for a plurality of half-bridge modules including the parallel synchronizer and connected in parallel as shown in the configuration 500 of FIG. 5, according to an embodiment of the present disclosure. For the purpose of illustration, two modules half-bridge-1 502 and half-bridge-2 504 are considered.

The waveforms 902, 904 illustrate the output of the half-bridge-1 and the waveforms 906, 908 illustrate the output of the half-bridge-2. The waveform 902 illustrates the on or off state of the HS driver 214 included in the half-bridge-1; and the waveform 904 illustrates the on or off state of the LS driver 224 included in the half-bridge-1. Similarly, the waveform 906 illustrates the on or off state of the HS driver 234 included in the half-bridge-2; and the waveform 908 illustrates the on or off state of the LS driver 244 included in the half-bridge-2.

It may be assumed that at time t7 901, both the HS drivers 214 and 234 receive a turn on signal from the PWM controller 102 and both the LS drivers 224 and 244 receive a turn off signal from the PWM controller 102. As can be seen from the waveforms 906, 908, and 909 the half-bridge-2's HS driver 234 turns on and LS driver 244 turns off at time t9 905.

Assuming that the half-bridge-1's HS driver 214 and LS driver 224 are faster than the half-bridge-2's HS driver 234 and LS driver 244, without the parallel synchronizer 602, the HS driver 214 would have turned on and LS driver 224 would have turned at time t8 903 as shown in FIG. 3.

However, because of both half-bridge-1 and half-bridge-2 are synchronized, the HS driver 214 now turns on and the LS driver 224 turns off, at the time t9 905 along with the half-bridge-2 drivers. As can be seen, since both the HS drivers are now synchronized, those are turned on at the same time t9 905; and the LS drivers 224 and 244 are turned off at the same time t9 905.

In the above specification, some common electronic circuits such as flip-flops or other digital circuits may be clocked by on-chip oscillators derived from phase locked loops (plls), crystal oscillators or any other conventional methods of generating a clock. In other embodiments, the clocks could be external as well.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A cross conduction prevention circuit for a switch-mode power supply coupled to receive an input voltage, an input current, and provide an output voltage and an output current to a load comprising a plurality of half-bridge circuits connected in parallel, each of the plurality of the half-bridge circuits comprising:
a high-side (HS) driver and a low-side (LS) driver,
the HS driver and the LS driver both having an on state and an off state,
the HS driver and the LS driver both coupled to change from the on state to the off state and vice versa in response to a pulse width modulation signal (PWM) signal,
the cross conduction prevention circuit comprising:
each HS driver in each half-bridge circuit being configured to output its own state and configured to sense a combined state of all the LS drivers via an LS synchronizing (sync) signal before turning on,
each LS driver in each half-bridge circuit being configured to output its own state and also configured to sense a combined state of all the HS drivers via a LS synchronizing signal before turning on,
wherein all the HS drivers are coupled to change from the off state to the on state in a synchronous manner only when the combined state of all the LS drivers is off, and
wherein all the LS drivers are coupled to change from the off state to the on state in a synchronous manner only when the combined state of all the HS drivers is off to prevent any current from any HS driver to any LS driver or vice versa.

2. The circuit according to claim 1, wherein each HS sync signal of each of the plurality of half-bridge circuits is coupled to every other HS sync signal of the remaining plurality of the half-bridge circuits using a wired connection;

wherein each LS sync signal of each of the plurality of half-bridge circuits is coupled to every other LS sync signal of the remaining plurality of the half-bridge circuits using a wired connection.

3. The circuit according to claim 2, wherein
the combined state of all the HS drivers is on when any HS driver is the on state,
the combined state of all the HS drivers is off when all the HS drivers are in the off state,
the combined state of all the LS drivers is on when any LS driver is the on state, and
the combined state of all the LS drivers is off when all the LS drivers are in the off state.

4. The circuit of claim 1, further comprising:
an HS input/output (I/O) circuit,
an LS I/O circuit,
a logic circuit,
and a timing circuit.

5. The circuit of claim 4 wherein the HS I/O circuit further comprises:
a first pull-up resistor coupled to connect the HS sync signal to a non-zero voltage when the HS driver is off,
a first pull-down transistor configured to connect the HS sync signal to the ground when the HS driver is on, and
a first inverter,
wherein the LS I/O circuit further comprises:
a second pull-up resistor coupled to connect the LS sync signal to a non-zero voltage when the LS driver is off,
a second pull-down transistor configured to connect the LS sync signal to the ground when the LS driver is on, and
a second inverter.

6. The circuit of claim 4 wherein the logic circuit comprises:
a NOR gate,
an AND gate,
a first comparator coupled to compare a drain to source voltage or a gate to source voltage or a voltage proportional to a drain current of the HS transistor to a first reference voltage;
wherein the output of the first comparator is high when anyone of the drain to source voltage or the gate to source voltage or the voltage proportional to the drain current of the HS driver is higher than the first reference voltage, wherein
the output of the first comparator is low when anyone of the drain to source voltage or the gate to source voltage or the voltage proportional to the drain current of the HS driver is lower than the first reference voltage, wherein
the first pull-down transistor is turned on when the output of the first comparator is high indicating that the HS driver is on; and wherein
the first pull-down transistor is turned off when the output of the first comparator is low indicating that the HS driver is off;
the logic circuit further comprising:
a second comparator coupled to compare a drain to source voltage or a gate to source voltage or a voltage proportional to a drain current of the LS transistor to a second reference voltage;
wherein the output of the second comparator is high when anyone of the drain to source voltage or the gate to source voltage or the voltage proportional to the drain current of the LS driver is higher than the first reference voltage, wherein the output of the second comparator is low when anyone of the drain to source voltage or the gate to source voltage or the voltage proportional to the drain current of the LS driver is lower than the first reference voltage, wherein
the second pull-down transistor is turned off when the output of the second comparator is low indicating that the LS driver is on; and wherein
the second pull-down transistor is turned off when the output of the second comparator is low indicating that the HS driver is off.

7. The circuit of claim 6, wherein
the AND gate and the NOR gate together are coupled to turn on the LS driver when the HS sync signal is high indicating that the combined state of all the HS drivers is off, and wherein
the AND gate and the NOR gate together are coupled to turn on the HS driver when the LS sync signal is high indicating that the combined state of all the LS drivers is off.

8. A method for preventing cross conduction for a switch-mode power supply coupled to receive an input voltage, an input current, and provide an output voltage and an output current to a load comprising a plurality of half-bridge circuits connected in parallel,
each of the plurality of the half-bridge circuits comprising:
a high-side (HS) driver and a low-side (LS) driver,
the HS driver and the LS driver both having an on state and an off state,
the HS driver and the LS driver both coupled to change from the on state to the off state and vice versa in response to a pulse width modulation signal (PWM) signal,
the method comprising:
configuring each HS driver in each half-bridge circuit to output its own state and
sensing a combined state of all the LS drivers via an LS synchronizing (sync) signal before being turned on,
configuring each LS driver in each half-bridge circuit to output its own state and sensing a combined state of all the HS drivers via a LS synchronizing signal before being turned on,
coupling all the HS drivers to change from the off state to the on state in a synchronous manner only when the combined state of all the LS drivers is off,
coupling all the LS drivers to change from the off state to the on state in a synchronous manner only when the combined state of all the HS drivers is off, and
preventing any current from any HS driver to any LS driver or vice versa.

9. The method according claim 8, further comprising:
coupling each HS sync signal of each of the plurality of half-bridge circuits to every other HS sync signal of the remaining plurality of the half-bridge circuits using a wired connection;
and coupling each LS sync signal of each of the plurality of half-bridge circuits to every other LS sync signal of the remaining plurality of the half-bridge circuits using a wired connection.

10. The method according to claim 9, wherein
the combined state of all the HS drivers is on when any HS driver is the on state,
the combined state of all the HS drivers is off when all the HS drivers are in the off state,
the combined state of all the LS drivers is on when any LS driver is the on state, and the combined state of all the LS drivers is off when all the LS drivers are in the off state.

11. The method of claim 8, further comprising:
an HS input/output (I/O) circuit,
an LS I/O circuit,
a logic circuit,
and a timing circuit.

12. The method of claim 8, further comprising:
connecting the HS sync signal to a non-zero voltage when the HS driver is off via an HS input/output (I/O) circuit,
connecting the HS sync signal to ground when the HS driver is on via a first pull-down transistor configured,
connecting the LS sync signal to a non-zero voltage when the LS driver is off via an LS input/output (I/O) circuit,
connecting the LS sync signal to ground when the LS driver is on via a second pull-down transistor, and a second inverter.

13. The method of claim 11 wherein the logic circuit comprises:
a NOR gate,
an AND gate, the method further comprising:
comparing via a first comparator a drain to source voltage or a gate to source voltage or a voltage proportional to a drain current of the HS transistor to a first reference voltage;
configuring the output of the first comparator to be high when anyone of the drain to source voltage or the gate to source voltage or the voltage proportional to the drain current of the HS driver is higher than the first reference voltage, wherein
configuring the output of the first comparator to be low when anyone of the drain to source voltage or the gate to source voltage or the voltage proportional to the drain current of the HS driver is lower than the first reference voltage, wherein
turning on the first pull-down transistor when the output of the first comparator is high indicating that the HS driver is on; and wherein
turning off the first pull-down transistor when the output of the first comparator is low indicating that the HS driver is off;
comparing via a second comparator a drain to source voltage or a gate to source voltage or a voltage proportional to a drain current of the LS transistor to a second reference voltage;
configuring the output of the second comparator to be high when anyone of the drain to source voltage or the gate to source voltage or the voltage proportional to the drain current of the LS driver is higher than the first reference voltage, wherein
configuring the output of the second comparator to be low when anyone of the drain to source voltage or the gate to source voltage or the voltage proportional to the drain current of the LS driver is lower than the first reference voltage,
turning on the second pull-down transistor when the output of the second comparator is high indicating that the LS driver is on; and
turning off the second pull-down transistor when the output of the second comparator is low indicating that the LS driver is off.

14. A cross conduction prevention system for a switch-mode power supply to receive an input voltage, an input current, and provide an output voltage and an output current to a load comprising a plurality of half-bridge circuits connected in parallel,
each of the plurality of the half-bridge circuits comprising:
a high-side (HS) driver and a low-side (LS) driver,
the HS driver and the LS driver both having an on state and an off state,
the HS driver and the LS driver both coupled to change from the on state to the off state and vice versa in response to a pulse width modulation signal (PWM) signal,
the cross conduction prevention circuit comprising:
each HS driver in each half-bridge circuit being configured to output its own state and configured to sense a combined state of all the LS drivers via an LS synchronizing (sync) signal before turning on,
each LS driver in each half-bridge circuit being configured to output its own state and also configured to sense a combined state of all the HS drivers via a LS synchronizing signal before turning on,
wherein all the HS drivers are coupled to change from the off state to the on state in a synchronous manner only when the combined state of all the LS drivers is off, and
wherein all the LS drivers are coupled to change from the off state to the on state in a synchronous manner only when the combined state of all the HS drivers is off to prevent any current from any HS driver to any LS driver or vice versa.

15. The system according claim 14, wherein each HS sync signal of each of the plurality of half-bridge circuits is coupled to every other HS sync signal of the remaining plurality of the half-bridge circuits using a wired connection;
wherein each LS sync signal of each of the plurality of half-bridge circuits is coupled to every other LS sync signal of the remaining plurality of the half-bridge circuits using a wired connection.

16. The system according to claim 15, wherein
the combined state of all the HS drivers is on when any HS driver is the on state,
the combined state of all the HS drivers is off when all the HS drivers are in the off state,
the combined state of all the LS drivers is on when any LS driver is the on state, and
the combined state of all the LS drivers is off when all the LS drivers are in the off state.

17. The system of claim 14, further comprising:
an HS input/output (I/O) circuit,
an LS I/O circuit,
a logic circuit,
and a timing circuit.

18. The system of claim 17 wherein the HS I/O circuit further comprises:
a first pull-up resistor coupled to connect the HS sync signal to a non-zero voltage when the HS driver is off,
a first pull-down transistor configured to connect the HS sync signal to the ground when the HS driver is on, and
a first inverter,
wherein the LS I/O circuit further comprises:
a second pull-up resistor coupled to connect the LS sync signal to a non-zero voltage when the LS driver is off,
a second pull-down transistor configured to connect the LS sync signal to the ground when the LS driver is on, and
a second inverter.

19. The circuit of claim 17 wherein the logic circuit comprises:
a NOR gate,
an AND gate, a first comparator coupled to compare a drain to source voltage or a gate to source voltage or a voltage proportional to a drain current of the HS transistor to a first reference voltage;

wherein the output of the first comparator is high when anyone of the drain to source voltage or the gate to source voltage or the voltage proportional to the drain current of the HS driver is higher than the first reference voltage, wherein the output of the first comparator is low when anyone of the drain to source voltage or the gate to source voltage or the voltage proportional to the drain current of the HS driver is lower than the first reference voltage, wherein the first pull-down transistor is turned on when the output of the first comparator is high indicating that the HS driver is on; and wherein the first pull-down transistor is turned off when the output of the first comparator is low indicating that the HS driver is off;

the logic circuit further comprising:
  a second comparator coupled to compare a drain to source voltage or a gate to source voltage or a voltage proportional to a drain current of the LS transistor to a second reference voltage;

wherein the output of the second comparator is high when anyone of the drain to source voltage or the gate to source voltage or the voltage proportional to the drain current of the LS driver is higher than the first reference voltage, wherein the output of the second comparator is low when anyone of the drain to source voltage or the gate to source voltage or the voltage proportional to the drain current of the LS driver is lower than the first reference voltage, wherein the second pull-down transistor is turned off when the output of the second comparator is low indicating that the LS driver is on; and wherein the second pull-down transistor is turned off when the output of the second comparator is low indicating that the HS driver is off.

20. The system of claim 19, wherein the AND gate and the NOR gate together are coupled to turn on the LS driver when the HS sync signal is high indicating that the combined state of all the HS drivers is off, and wherein the AND gate and the NOR gate together are coupled to turn on the HS driver when the LS sync signal is high indicating that the combined state of all the LS drivers is off.

\* \* \* \* \*